United States Patent
Fricke et al.

(10) Patent No.: US 6,858,883 B2
(45) Date of Patent: *Feb. 22, 2005

(54) PARTIALLY PROCESSED TUNNEL JUNCTION CONTROL ELEMENT

(75) Inventors: Peter J. Fricke, Corvallis, OR (US); Janice H. Nickel, Sunnyvale, CA (US); Andrew L. Van Brocklin, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/454,552

(22) Filed: Jun. 3, 2003

(65) Prior Publication Data

US 2004/0245544 A1 Dec. 9, 2004

(51) Int. Cl.$^7$ ............................................. H01L 29/88
(52) U.S. Cl. ..................... 257/104; 257/104; 257/530
(58) Field of Search ........................... 257/104, 530, 257/5, 52, 295, 296; 365/163, 51

(56) References Cited

U.S. PATENT DOCUMENTS

| | | | |
|---|---|---|---|
| 3,271,591 A | 9/1966 | Ovshinsky | 307/88.5 |
| 3,530,441 A | 9/1970 | Ovshinsky | 340/173 |
| 3,641,516 A | 2/1972 | Castrucci et al. | 340/173 SP |
| 4,499,557 A | 2/1985 | Holmberg et al. | 365/163 |
| 4,599,705 A | 7/1986 | Holmberg et al. | 365/163 |
| 5,335,219 A | 8/1994 | Ovshinsky et al. | 369/288 |
| 5,625,220 A | 4/1997 | Liu et al. | 257/530 |
| 5,659,500 A | 8/1997 | Mehrad | 365/185.05 |
| 5,751,012 A | 5/1998 | Wolstenholme et al. | 257/5 |
| 5,821,558 A | 10/1998 | Han et al. | 257/52 |
| 5,835,396 A | 11/1998 | Zhang | 365/51 |
| 5,942,777 A | 8/1999 | Chang | 257/296 |
| 6,002,607 A | 12/1999 | Dvir | 365/103 |
| 6,026,017 A | 2/2000 | Wong et al. | 365/185.05 |
| 6,033,955 A | 3/2000 | Kuo et al. | 438/257 |
| 6,034,882 A | 3/2000 | Johnson et al. | 365/103 |
| 6,111,302 A | 8/2000 | Zhang et al. | 257/530 |
| 6,185,121 B1 | 2/2001 | O'Neill | 365/94 |
| 6,185,122 B1 | 2/2001 | Johnson et al. | 365/103 |
| 6,331,944 B1 * | 12/2001 | Monsma et al. | 365/171 |
| 6,351,406 B1 | 2/2002 | Johnson et al. | 365/103 |
| 6,429,497 B1 | 8/2002 | Nickel | 257/421 |
| 6,711,045 B2 * | 3/2004 | Fricke et al. | 365/63 |
| 2001/0011776 A1 | 8/2001 | Igarashi et al. | 257/776 |
| 2001/0055838 A1 | 12/2001 | Walker et al. | 438/129 |

OTHER PUBLICATIONS

Victor W.C. Chan et al., "Multiple Layers of CMOS Inegrated Circuits Using Recrystallized Silicon Film" IEEE Electron Device Letters, V. 22, No. 2 (Feb. 2001) pp. 77–79.

Thomas H. Lee, "A Vertical Leap for Microchips," Scientific American, Jan. 2002, pp. 53–59.

Esmat Hamdy et al., "Dielectric based antifuses for logic memory ICs" IEEE International Electron Devices Meeting, IEDM 88 (Aug. 1988) pp. 786–789.

Chenming Hu, "Interconnect devices for field programmable gate array." IEEE International Electron Devices Meeting, IEDM 92 (Apr. 1992) pp. 591–594.

(List continued on next page.)

*Primary Examiner*—David Nelms
*Assistant Examiner*—Thinh T Nguyen

(57) ABSTRACT

A memory system, including a first electrode, a memory storage element, and a control element. The control element having a breakdown voltage. The breakdown voltage is increased by partially-processing the control element. In one aspect, the partial-processing results by processing the control element for a briefer duration than the memory storage element. In another aspect, the partial-processing results by forming the control element from a plurality of layers, some of the plurality of layers are unprocessed while other ones of the plurality of layers are fully processed.

34 Claims, 6 Drawing Sheets

OTHER PUBLICATIONS

Jonathan Green et al., "Antifuse Field Programmable Gate Arrays" Proc. IEEE vol. 81 No. 7 (Jul. 1993), pp. 1042–1056.

Vivek D. Kulkarni et al. "Patterning of Submicron Metal Features and Pillars in Multilevel Metallization" J. Electrochem. Soc. vol. 135 No. 12 (Dec. 1988) pp. 3094–3098.

* cited by examiner

PARTIALLY PROCESSED TUNNEL JUNCTION CONTROL ELEMENT

BACKGROUND

As the cost of computers and other electrical equipment continue to drop in price, the manufacturers of storage devices, such as memory devices and hard drives, are forced to lower the cost of their components. At the same time: computers, video games, television, and other electrical device markets are requiring increasingly larger amounts of memory to store their respective images, photographs, videos, movies, music and/or other storage intensive data. Thus, besides reducing cost, manufacturers of storage devices are also pressured to increase the storage density of their devices to remain competitive. This trend of increasing memory storage density while reducing cost required to create the storage has been on-going for many years, and even optical storage such as CD-ROM, CD-R, CD-R/W, DVD, and DVD-R variants are being challenged by device size limitations and cost.

To improve the operation of memory storage elements, it is often desired to increase breakdown voltages of either the memory storage element or an associated control element. One prior art solution to increase the breakdown voltage involves the use of area ratioing between two tunnel junction devices (that function as the memory storage element and the associated control element) that are arranged in series to protect one of the tunnel junctions. Multiple masks are required to area ratio tunnel junction devices. Such use of multiple masks requires additional costs, processing time, and processing complexities. Area ratioing between tunnel junctions in series requires subminimum and/or sub lithographic processing and structures which increase manufacturing yield losses, with resulting higher cost. There is accordingly a need for economical, high capacity memory structures.

BRIEF DESCRIPTION OF THE DRAWINGS

The same numbers are used throughout the drawings to reference like features and components. The features and advantages of the disclosure will readily be appreciated by persons skilled in the art from the following detailed description when read in conjunction with the drawings wherein.

DETAILED DESCRIPTION

This disclosure describes a variety of embodiments of cross point memory cells 20 that include a tunnel junction isolation element. Certain embodiments of the tunnel junction isolation element include a partially-processed (e.g. under-oxidized) base material. In other embodiments, the tunnel junction isolation element includes multiple layers, certain ones of which are normally oxidized and other ones of which are under-oxidized (or not oxidized at all) or under-nitrided. Both of these embodiments are referred to in this disclosure as "under-oxidized" or "partially-processed" within the scope of the present disclosure. The partially-processed base materials as disclosed herein increase the breakdown voltage.

The cross point memory cell 20 is utilized in multi layer cross-point memory array 10 to controllably isolate selected memory cells. Each cross point memory cell 20 is an isolation control element implemented in series with a tunnel junction write once memory storage element. The improved voltage breakdown of isolation tunnel junction protects it while the storage tunnel junction is programmed at a lower breakdown voltage. One patent that describes partial-processing and is assigned to the assignee to the present disclosure is U.S. Pat. No. 6,429,497 that issued on Aug. 6, 2002 to Nickel (incorporated by reference in its entirety).

Figure 1:
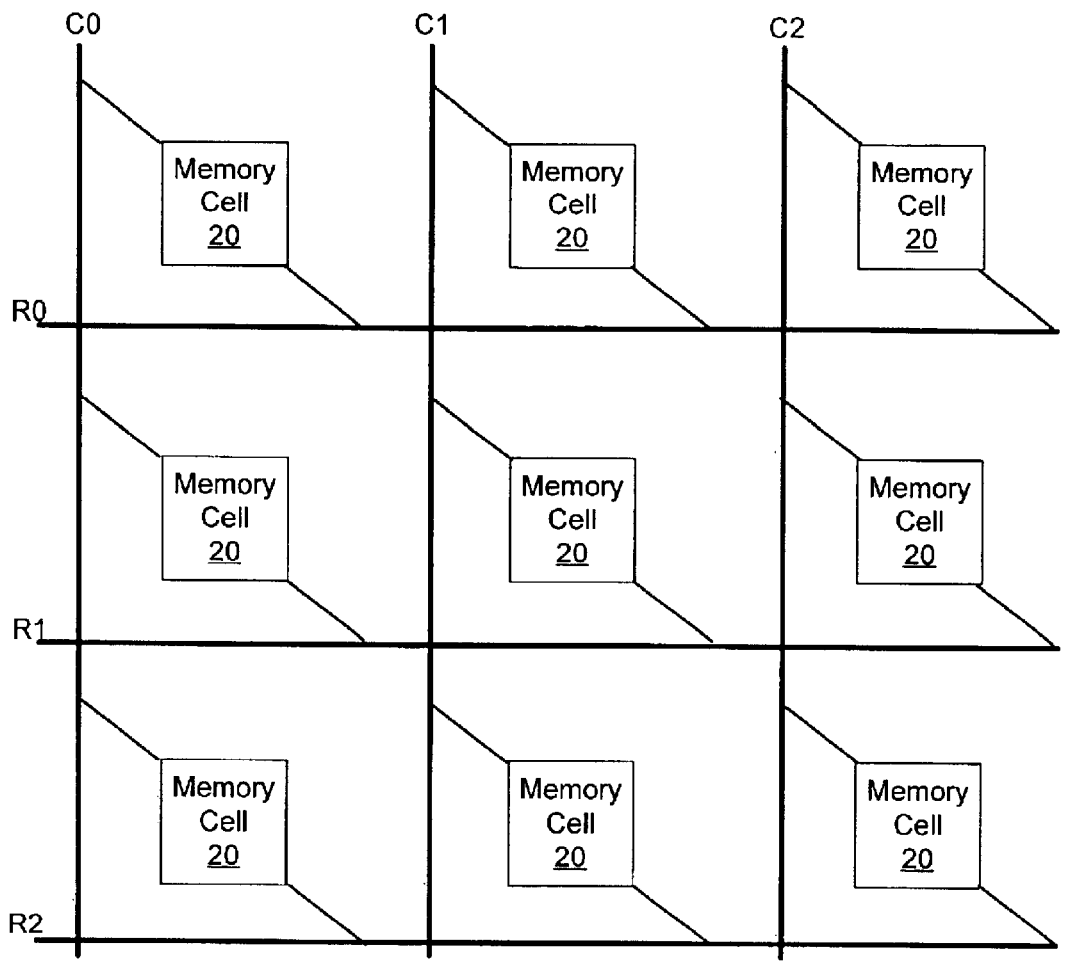
FIG. 1 is a schematic diagram of an embodiment of a cross point memory cell.

For each cross point memory cell 20, two tunnel junctions are arranged in series. Using two tunnel junctions requires characteristics that allow one tunnel junction to be programmed while the other tunnel junction remains intact. Additionally, improving the breakdown voltage for the tunnel junction to remain intact allows the other tunnel junction to be programmed at a lower voltage, while the remaining tunnel junction is protected. FIG. 1 is a simplified schematic diagram of an embodiment of a cross-point memory array 10 in which the disclosed memory cell structures can be utilized. The memory arrangement 10 includes a plurality of row selection conductor lines R0, R1, R2 and a plurality of column selection conductor lines C0, C1, C2. One cross-point memory cell 20 is connected at the intersection between each row selection conductor line R0, R1, R2 and each column selection conductor line C0, C1, C2. Only a few of each of the row selector conductor lines and the column selection conductor lines are illustrated herein for brevity. As many of the row selector conductor lines and the column selection conductor lines as are desired to perform the desired function while remaining within the allowed surface area on the substrate may be provided. The row selection conductor lines R0, R1, R2 and the column selection conductor lines C0, C1, C2 are respectively referred to by "row" and "column" terminology for convenience, though they do not necessarily have to be physically arranged in rows and columns.

Each memory cell 20 is uniquely accessible and/or selectable by using a plurality of address selection lines. The address selection lines can be oriented in a variety of configurations. The application and use of address selection lines is generally known in such technologies as multiplexers/demultiplexers, sensors, computer memory data storage devices, and data accessing devices and will not be further described herein. The column selection conductor lines C0, C1, C2 do not have to be orthogonal to (or have similar widths or other configurations as) the row selection conductor lines R0, R1, R2, but are illustrated in that manner for ease of understanding.

Figure 2:
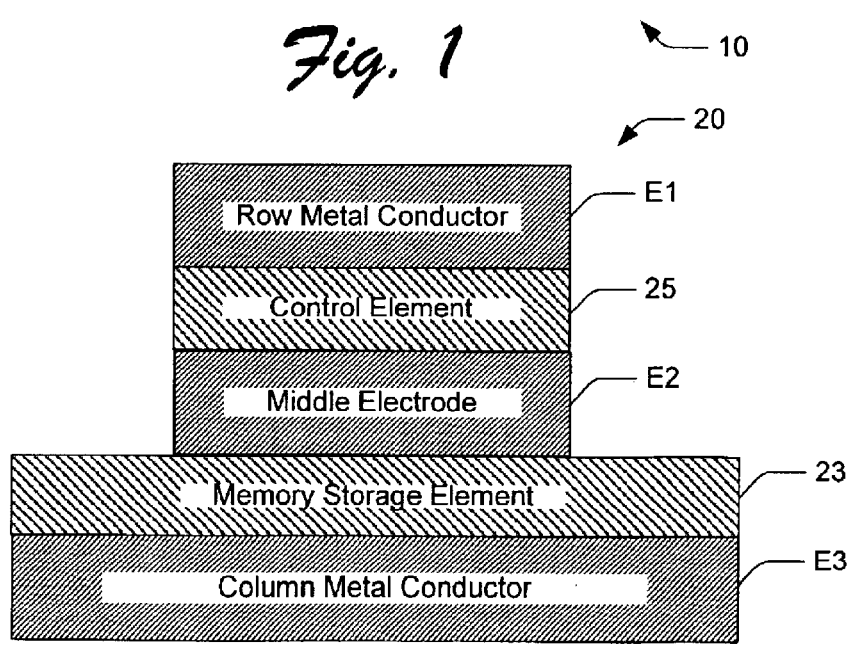
FIG. 2 is a schematic block diagram of an embodiment of a memory cell that includes a memory storage element and a control element for the memory storage element.

FIG. 2 shows a simplified cross section block diagram of an embodiment of the memory cell 20 that includes a memory storage element 23, a control element 25, and a plurality of electrodes E1, E2, and E3. The memory storage element 23 and the control element 25 are respectively serially connected between the respective electrodes E1 and E3. The electrode E2 electrically connects (and physically separates) the memory storage element 23 and the control element 25. The electrodes E1, E2, and E3 may be fabricated as electrically conductive elements, conductive regions, conductive pads, or other conductive devices, and it should be appreciated that each electrode E1, E2, or E3 can comprise one or more electrically conductive elements. The column metal conductor E3 and the memory storage element 23 are both shown as being wider than each of the row metal conductor E1, the control element 25, and the middle electrode E2 since area ratioing between the memory storage element 23 and the control element 25 is permitted in certain embodiments (but is not necessary and is not provided in other embodiments). In one embodiment, the column metal conductor E3 is configured to extend across all row metal conductors E1 as shown in FIG. 1 (and vice versa).

The embodiment of memory storage element 23 described relative to FIG. 2 is configured as a "change state" memory storage element. As such, the control element 25 is configured to control the operation of the change state memory storage element 23 by providing a selectable and controllable electric current to the memory storage element. More particularly, during operation, the memory storage element 23 predictably and reliably breaks down to change state at a lower energy level than the control element 25, while the control tunnel junction region is configured for sustained operation as a control element for the memory.

During normal operation of many embodiments of the memory cell 20, as described in this disclosure, the break down voltage of the control element 25 is desired to be greater than the break down voltage of the memory storage element 23. The memory storage element 23 changing state at a lower energy level than the control element 25 allows the memory storage element 23 to be programmed from a "low" state to a "high" state, or vice versa. In this manner, each cross point memory cell 20 operates (i.e., is programmed) by selectively providing sufficient energy to the cross point memory cell 20 to cause the memory storage element to change state. Each cross point memory cell 20 is read by providing a lesser amount of energy to the cross point memory cell 20, and then sensing how much current flows through the cross point memory cell depending upon whether the cross point memory cell has been previously programmed to the high state.

This disclosure provides a variety of mechanisms by which the relative breakdown voltages of the control element 25 can be increased relative to the memory storage element 23. One such mechanism involves altering the ratio of the areas between the control element 25 and the memory storage element 23. Another mechanism involves partial processing of the control element 25 compared to the memory storage element 23. These mechanisms can be performed alone or in combination to provide the relative breakdown voltage of the control element 25 and the memory storage element 23.

Each one of the memory storage element 23 and the control element 25 includes a cross-sectional area through which current flows. For example, such area can be defined by the overlap of the interfaces between the element and the electrodes on either side of the element. In the embodiments of the memory cells 20 disclosed herein, the control element 25 can be the same device type as the memory storage element 23. In one embodiment, the cross-sectional area of the control element 25 is greater than the cross-sectional area of the memory storage element 23, for example such that the memory storage element will break down at a lower energy level than the control element. In certain embodiments, therefore, the cross-sectional area ratio between the control element and the memory storage element can be selected so the break down voltage of the control element 25 will be higher than the break down voltage of the memory storage element 23. With these relative break-down voltages, the memory storage element 23 functions as a state change memory storage element; while the control element 25 is configured for sustained operation as a control element for the memory storage element 23.

In other embodiments, the cross-sectional area of the control element 25 is substantially the same as the cross-sectional area of the memory storage element 23. In these configurations, the breakdown voltage is not affected by the cross-sectional area of the control element 25 and the memory storage element 23.

The variation of break down voltages in which the break down voltage of the control element 25 is higher than the break down voltage of the memory storage element 23 can be provided by providing partial-processing to the base material of the control element 25. This variation of the break-down voltage can be provided exclusively by the partially-processed control element, or by the combination of the partially-processed control element and the variation of the cross-sectional ratios between the control element 25 and the memory storage element 23.

There are a variety of embodiments of the memory storage element 23. The memory storage element 23 can be fabricated from the group of materials including, but not limited to, a resisitive material, a trap-induced hysteresis material, a ferroelectric capacitor material, a polymetric capacitor material, a Hall effect material, a tunneling magneto-resistive material, a rewriteable phase change material, an organic phase change material, or a tunnel junction.

The memory storage element 23 can be configured to act as a variety of devices such as a charge coupled device, an organic material device, an antifuse device, a fuse device, a silicide switch, or a LeCombre switch device. Memory storage elements that can act as an antifuse or fuse can be formed including material from the group including, but not limited to, an oxidized metal tunnel junction, a silicon dioxide tunnel junction, a dielectric-rupture, a polysilicon semiconductor, an organic material, a polycrystalline semiconductor, an amophous semiconductor, a microcrystalline semiconductor, a metal filament electro-migration semiconductor, and a polysilicon resistor semiconductor.

Antifuse and fuse devices, particularly fuses, can store data. Fuses operate such that they have a low resistance when initially fabricated and a dramatically increased resistance by application of a sufficient pulse of energy that is of a level that causes the fuse to fail. This type of technology is applicable, for example, to programmable read-only memory (PROM) devices. The programming is achieved by applying a sufficient current to desired ones of the fuses to cause those fuses to fail, thus permanently storing data (e.g., blown fuse equates to a high digital value while a closed fuse break equates to a low digital value).

In contrast to fuse devices (which have low resistance in an initial state), antifuse devices typically have a larger resistance in an initial state and less resistance in a "blown" or activated state. Antifuses can also be used for data storage. One prior art antifuse structure consists of a thin oxide/nitride/oxide (ONO) layer sandwiched, for example, between a heavily doped n+ diffused region and a heavily doped n+ polysilicon electrode. By applying a sufficiently large voltage pulse to this structure, the antifuse device will break down leading to a large current flow to the device. This in turn causes localized heating and the resultant formation of a short between the electrodes. Once a short has formed in the antifuse device, the resistance of the structure drops, for example, from greater than 10,000 Ohms to approximately 100 Ohms, depending on the current allowed to flow during the fuse programming. This embodiment of the antifuse device is configured as a tunnel junction device.

The tunnel junction forming the control element 25 and the memory storage element 23 can be formed from oxidized metal, thermally grown oxide, or deposited oxides or nitrides. The memory storage element may also be embodied with semiconductor materials such as polysilicon, polycrystalline silicon, amorphous silicon, microcrystalline silicon, metal filament electro migration, trap induced hysterisis, ferroelectric capacitor, Hall effect, and polysilicon resistors. Other embodiments of the memory storage element include tunneling magneto-resistive or capacitive elements as floating gates. Still further, the memory storage element can be a read only LeComber or silicide switch or a re-writable phase-change material including a write-erase-write phase change material. In yet another embodiment, the memory storage element can also comprise a PIN diode or a Schottky diode, but not if they are partially processed.

In one embodiment of this disclosure, both the memory storage element 23 and the control element 25 can be configured as tunnel junction devices. The control element 25 can comprise a tunnel junction device or PN, PIN, or Schottky diodes. Other diodes that can be used include Zener diodes, avalanche diodes, tunnel diodes, and a four-layer diode such as a silicon controlled rectifier. Other embodiments of the control element 25 can be configured as a transistor (e.g., a junction field effect transistor or a bipolar junction transistor). The control element 25 is sufficiently sized to carry an adequate current at which level the state of the storage element 23 is changed between its low state and its high state, or vice versa. The control element 25 can be formed using doped polysilicon, amorphous silicon, or microcrystalline silicon. The memory storage element 23 and the control element can also be of the same device type, wherein both can comprise tunnel junction devices, Schottky diodes, or PIN diodes, for example. The disclosed memory structures are described as employing tunnel junction devices as the memory storage elements 25 and control elements 23. The memory storage elements 25 and control elements 23 can be implemented as described in this disclosure.

By illustration, the disclosed memory structures will be shown as integrated circuits that include, for example, such interlayer dielectric as silicon dioxide, silicon nitride, or tetraethylorthosilicate (TEOS) that provide support and isolation between various structures of an integrated circuit. The interlayer dielectric (ILD) can be deposited using one or more different technologies such as chemical vapor deposition (CVD), atmospheric pressure CVD, low pressure CVD, plasma enhanced CVD, physical vapor deposition (PVD), and sputtering. For convenience, regions and layers of such dielectric are identified in the drawings by the reference designation ILD.

Figure 3:
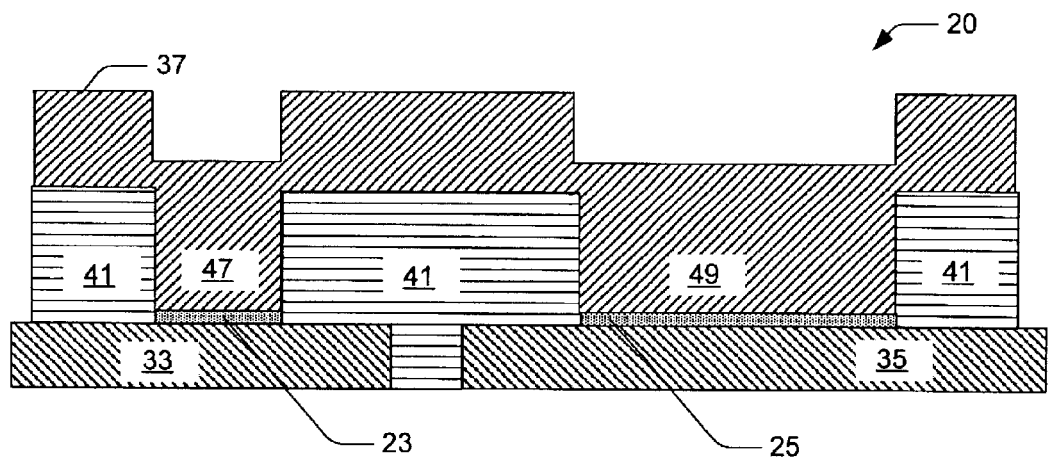
FIG. 3 is a sectional view that schematically depict an embodiment of a memory structure that includes a memory storage element and a control element.
Figure 4:
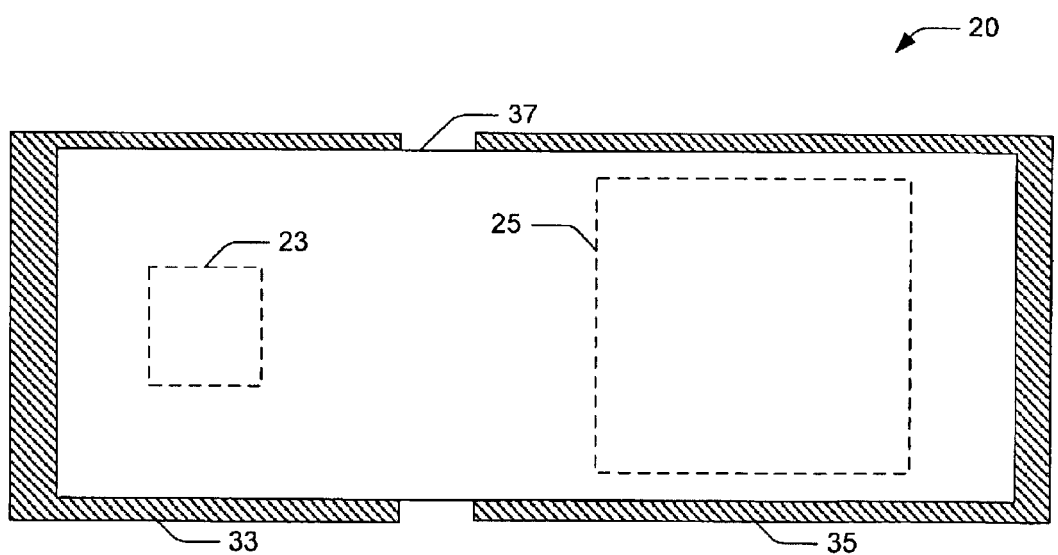
FIG. 4 is a top plan view that schematically depicts the embodiment of the memory structure shown in FIG. 3.

FIGS. 3 and 4 depict a respective side and top view of one embodiment of a memory cell 20 that includes a memory storage element 23 disposed on a first conductor 33. A control element 25 is disposed on a second conductor 35 that is laterally or transversely adjacent the first conductor 33. The memory storage element 23 and the control element 25 are thus horizontally, transversely, and/or laterally separated from each other. Both the memory storage element 23 and the control element 25 therefore can have a generally horizontal planar extent. The first conductor and the second conductor 33, 35 can be substantially coplanar, and the memory storage element 23 and the control element 25 can also be substantially co-planar. A dielectric layer 41 is disposed over the first and second conductors 33, 35 and is provided with openings 47, 49 that respectively extend over the memory storage element 23 and the control element 25. A conductive layer 37 is disposed on the dielectric layer 41 and extends into the openings 47, 49. The conductive layer 37 therefore forms an electrode that extends between the memory storage element 23 and the control element 25.

The memory storage element 23 can be formed of an oxide of the first conductor 33, while the control element 25 can be formed of an oxide of the underlying second conductor 35. Alternatively, the memory storage element 23 can be formed of an oxide that is different from an oxide of the first conductor 33, and the control element 25 can be formed of an oxide that is different from an oxide of the second conductor 35. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 5:
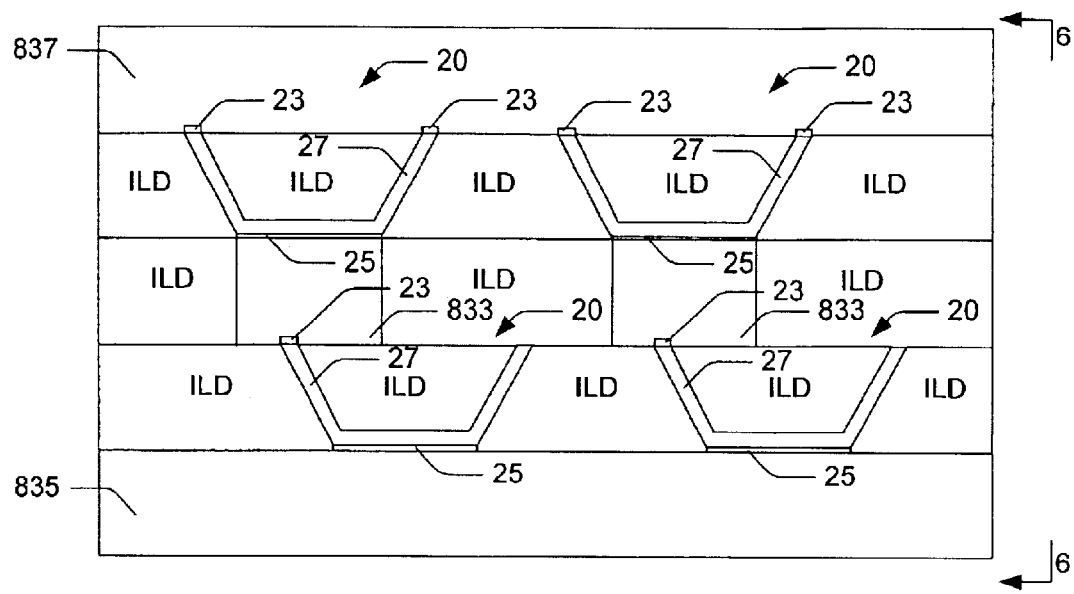
FIG. 5 is a sectional view of another embodiment of a memory structure that includes that includes a memory storage element and a control element.
Figure 6:
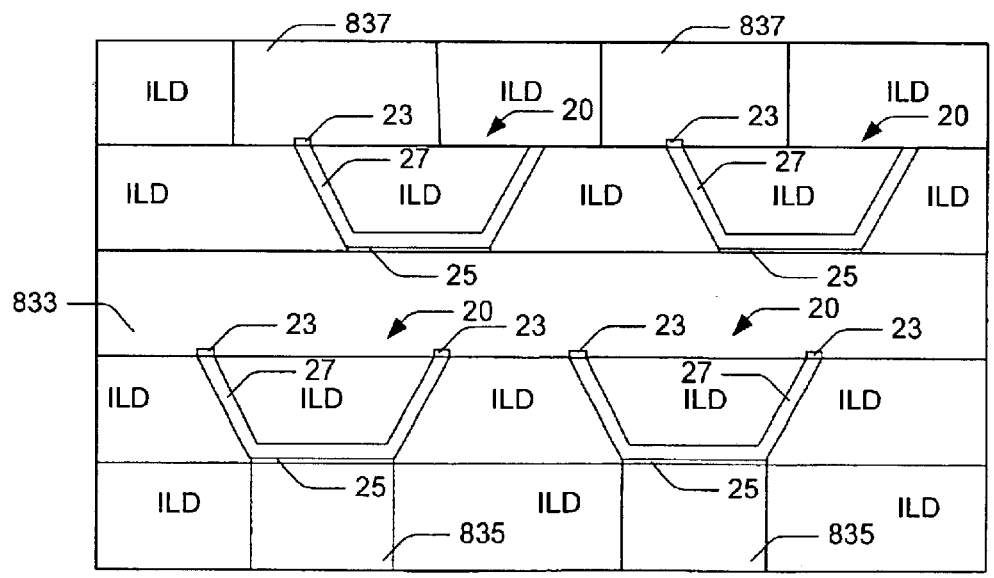
FIG. 6 is a sectional view of the embodiment of memory structure of FIG. 5 as taken through the sectional lines 6—6 of FIG. 5.

FIGS. 5 and 6 schematically depict an embodiment of a memory structure that includes a plurality of memory cells 20. Each memory cell 20 in FIGS. 5 and 6 include a memory storage element 23 disposed between the rim edge of a conductive well or tub 27 and a conductor 833 or 837 that is vertically spaced and adjacent to the rim edge. Each memory cell 20 further includes a control element 25 disposed between the base of the conductive tub 27, and a conductor 833 or 835 that is vertically adjacent the base. For a given memory cell 20, the memory storage elements 23 are vertically separated from the control element 25. Each one of the memory storage elements 23 and the control element 25 for a memory cell 20 as shown in FIGS. 5 and 6 has a horizontally planar extent. The memory cells 20 of FIGS. 5 and 6 can be considered as being implemented in stacked layers for example wherein a conductor 833 that is vertically adjacent the rim edge of a given conductive tub 27 is vertically adjacent the base of a conductive tub 27 that is in an adjacent layer.

By way of illustrative example, the conductor 833 can be a row selection line while the conductors 835, 837 can be column selection lines in a cross-point memory structure. Also by way of illustrative example, a conductive tub 27 can be laterally offset relative to the conductor 833 that is vertically adjacent the rim of such conductive tub 27. The control of the deposition outline of the conductive tub 27 can be provided using a deposited oxide layer or a completely oxidized deposited metal layer, for example.

Each memory cell 20 consists of a row contact or electrode, the control element 25, an intermediate electrode, the memory storage element 23, and a column contact or electrode. The control element 25 can consist of a tunnel junction oxide that in one illustrative embodiment is exactly 12.5 nm thick (but may have different dimensions in other embodiments). While the control element 25 in the embodiment of memory cell 20 shown in FIGS. 5 and 6 can be smaller in cross-section than the memory storage element 23 in certain embodiments of the present disclosure, it is envisioned that the control element 25 can be the same cross-sectional size as the memory storage element 23 while still providing an increased breakdown voltage. At least a portion of the increased breakdown voltage results from the partial-processing of the control element (multiple embodiments of the partial-processing are described in this disclosure).

The improved breakdown voltage of the control element 25 is achieved through partial-processing (e.g. under-oxidization or under-nitriding) of the base material of the tunnel junction. The base material of the tunnel junction control element 25 may be, for example, aluminum, boron, hafnium, magnesium, silicon, tantalum or tungsten and copper. When processed, these base materials are oxidized or nitrided into such electrical insulators as aluminum oxide, aluminum nitride, boron nitride, hafnium oxide, magnesium oxide, silicon dioxide, silicon nitride, tantalum oxide, tungsten oxide, and cuprous oxide.

Figure 7:
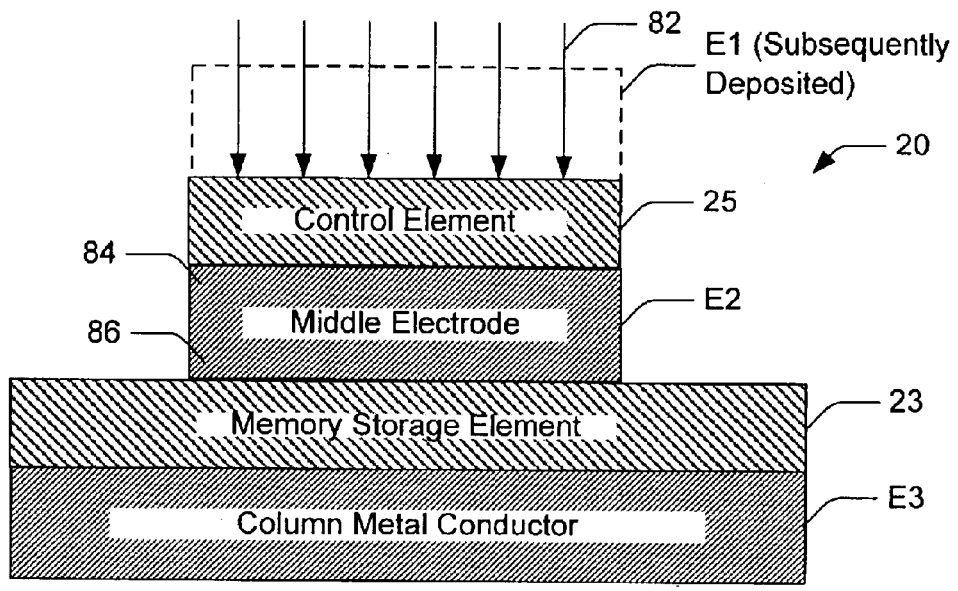
FIG. 7 is a cross-sectional view of one embodiment of an underprocessed control element within a memory cell.

As described in certain embodiments of the present disclosure, the breakdown voltage of the control element 25 can also be increased by under-processing the base material of the tunnel junction control element 25. One embodiment of an under-processed control element 25 is formed by processing (e.g., by oxidation or nitration) of the tunnel junction control element 25 in a similar manner to normal processing, but for a reduced duration. For example, the base material can be deposited and then processed by exposure to either nitrogen or oxygen (nitrided or oxidized), by a remote plasma (low energy oxygen or nitrogen ions), by a full plasma for a reduced duration, or by an ion beam method. Typically, the control element 25 being under-processed, or processed, results from the application of oxygen or nitrogen from the top down as shown by arrows 82 of FIG. 7. As a result of the top-down oxidation or nitriding, the density of the oxidization or nitriding within the partially-processed base material is substantially higher at the top portion 84 of the tunnel junction than at the bottom portion 86. Such oxidation or nitriding may be applied by ion implantation, or alternatively be exposing the material of the control element to oxygen or nitrogen using known techniques. The row metal conductor E1 as shown in FIG. 2 is not shown in FIG. 7 because this metal layer is fabricated after the control element is deposited and oxidized and nitrided.

The tunnel junction control element 25 has unprocessed base material in traces that are sufficient to substantially increase the break-down voltage of the tunnel junction. If the tunnel junction control element 25 is formed by under-processing, the desirable amount of unprocessed material can be controlled by reducing oxidation or nitridation time. For example, a 1.25 nm thick alumina tunnel junction having a fully processed tunnel junction might have a breakdown voltage between 1.75 volts and 2 volts. In contrast, a similar 1.25 nm cross-sectional under-processed tunnel junction might have a breakdown voltage between 4 volts and 4.5 volts.

These differences are illustrated by the following three samples that were fabricated. A first sample with alumina tunnel junction of 1.25 nm layer of aluminum and then oxidizing for 150 seconds resulted in break-down voltage of about 2 volts. A second sample prepared in the same manner except for oxidation time of 120 seconds resulted in break-down voltage of about 4 volts. A third sample prepared in the same manner except for oxidation time of 90 seconds resulted in breakdown voltage of about 4.5 volts. While these samples relating to partial processing oxidizing aluminum for a prescribed duration, it is envisioned that other materials may be oxidized, or alternatively aluminum or other materials may be nitrided to provide similar partial-processing results.

Figure 8:
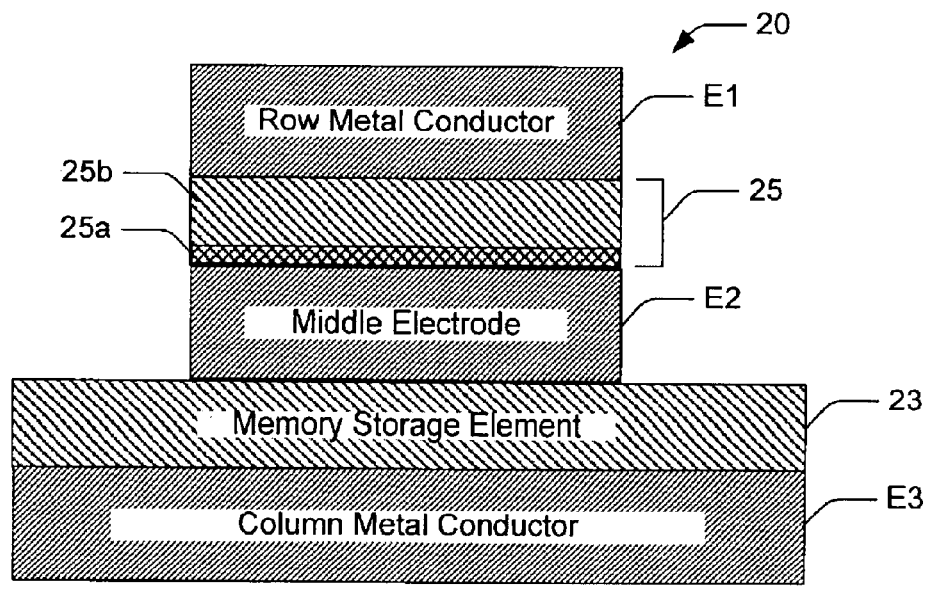
FIG. 8 is a cross-sectional view of another embodiment of an underprocessed control element within a memory cell.
Figure 9:
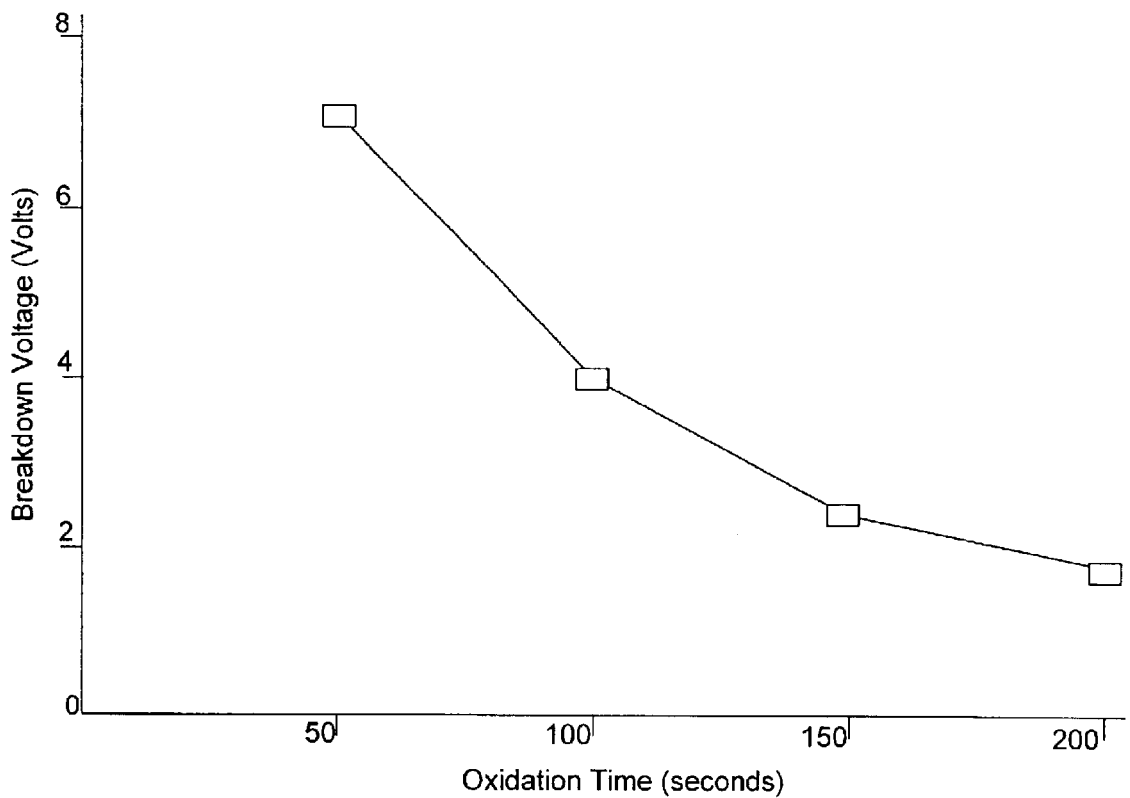
FIG. 9 is a graphical plot of oxidation time versus breakdown voltage for one embodiment of control element.

Another embodiment of under-processing results from forming the control element 25 in multiple layers 25*a* and 25*b* as shown in FIG. 8. For example, the tunnel junction control element 25 may be formed by depositing a layer of unprocessed base material 25*a* and depositing fully processed base material 25*b* on the layer of unprocessed base material. For example, a thin layer (e.g., 1–2 Angstroms) of the unprocessed base material is sputtered and an oxide or nitride is then r-f deposited on top. As a result of the multiple layers 25*a*, 25*b*, the density of the oxidization or nitriding within the partially-processed base material is substantially higher at the upper surface 84 of the tunnel junction than at the bottom surface 86. While the embodiment of under-processing shown in FIG. 8 is not necessarily a result of a reduction in the processing time, the resulting multi-layered structure as illustrated in FIG. 8 is operationally quite similar to that shown in FIG. 7. FIG. 9 shows a graph plotting an increase in the breakdown voltage (ordinate) of the control element 25 as a function of the oxidation time (abscissa). The FIG. 9 graph applies to oxidation of aluminum having a width of 1.25 nm, though similar results can be obtained for various materials, varying dimensions, and nitriding as well as oxidizing. The greater the oxidation time, the more fully-processed the control element. Conversely, the lesser the oxidation time, the more partially-processed the control element.

The tunnel junction control element 25 is combined in series with a memory storage element to form a cross point memory cell 20. An array of rows and columns contains the memory cell at each cross point intersection of the rows and columns. The arrays are also replicated vertically to form multiple layers of memory arrays.

There are multiple advantages provided by any embodiment of under-processing. Namely, under-processing of one tunnel junction device (i.e., the control element 25) allows two tunnel junction devices to be arranged in series while the control element 25 has a higher breakdown voltage. The memory cell 20 including two tunnel junction devices thereby remain intact when the storage tunnel junction is programmed by its lower break-down voltage. This configuration may allow for a thicker tunnel junction control element 25 with equivalent resistance to increase manufacturing control and tolerances.

Figure 10:
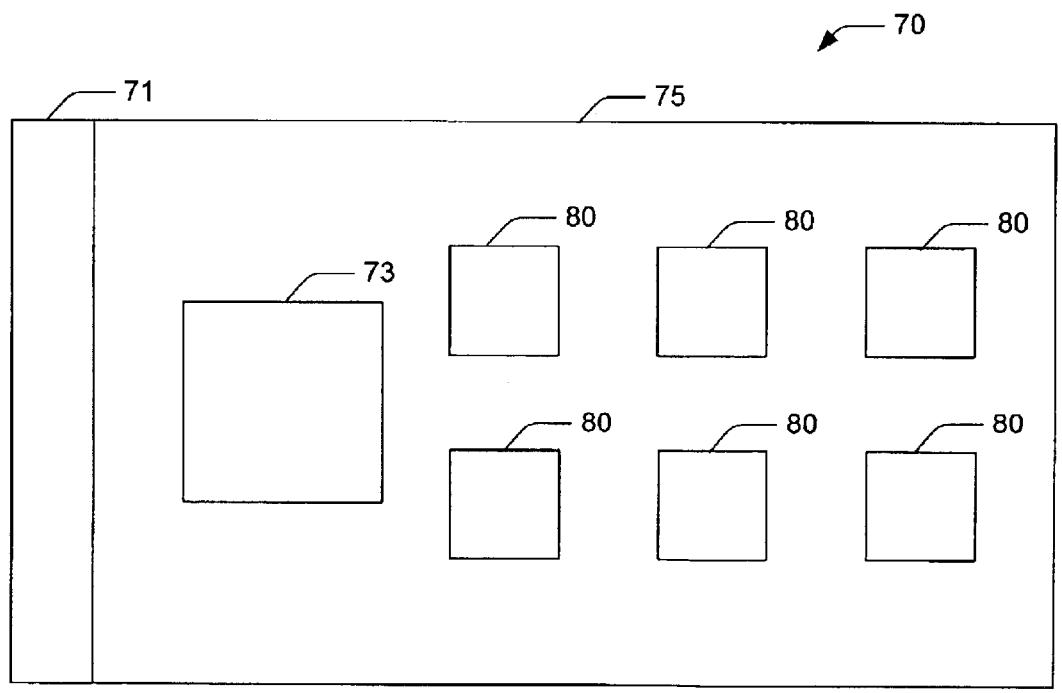
FIG. 10 is a schematic block diagram of an embodiment of a memory carrier that incorporates at least one of the disclosed memory cells.

FIG. 10 is a block diagram of a memory carrier 70 that incorporates an embodiment of the disclosure. The memory carrier represents any of standard or proprietary memory card formats such as PCMCIA, PC card, Smart memory, Memory Stick, digital film, ATA, and compact flash, to name a few. The memory carrier 70 includes a mechanical interface 71 that provides for mechanical and electrical connection with a particular connector for the type of memory carrier implemented. An optional electrical interface 73 makes electrical coupling with the electrical contacts on the mechanical connector 71 and provides for example security, address decoding, voltage translation, write protection, or other typical interface functions with a set of memory integrated circuits (ICs) 80 that incorporate at least one embodiment of the disclosure. A carrier 75, for example a printed circuit board or ceramic substrate, typically is used to physically support the memory ICs 80, electrical interface 73, and mechanical interface 71. It will be appreciated by those skilled in the art that some electrical devices might incorporate the functionality of the electrical interface 73.

Figure 11:
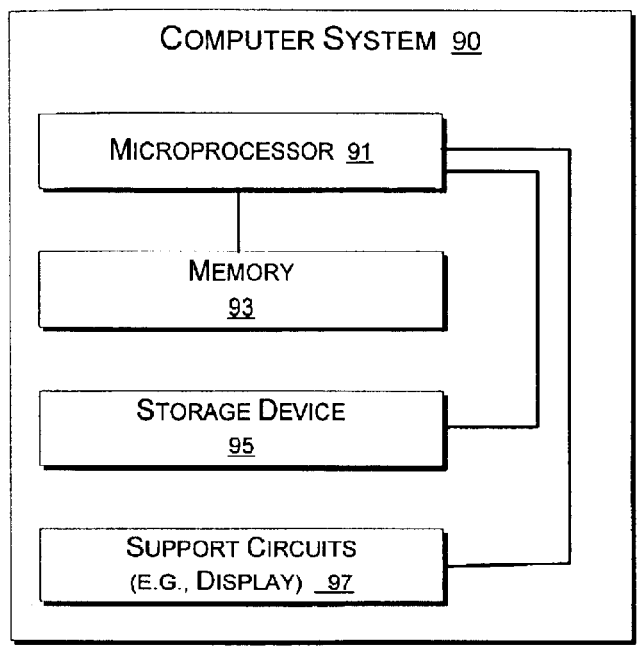
FIG. 11 is a schematic block diagram of an embodiment of an electronic device, such as a computer system, that incorporates at least one of the disclosed memory cells.

FIG. 11 is a block diagram of an electronic device, in this example a computer system 90 that can produce a partially-processed tunnel junction device such as disclosed. Such partial processing relates to the time that a process (such as oxidation) is applied to a particular material. As such, the computer system is configured to control the time at which certain processes are applied to a substrate, or a portion thereof. In particular for the computer system 90, several different electrical devices as shown may be incorporated into the package. For example, a microprocessor 91 is coupled to a memory circuit 93 used to store computer executable instructions and/or user data. Exemplary memory circuits 93 include BIOS memory, random access memory (RAM), read only memory (ROM) and various levels of internal or external cache memory. The microprocessor 91 is also connected to a storage device 95 such as a hard disk drive, floppy drive, CD/DVD drive, tape drive or other mass storage devices such as those that incorporate semiconductor memory ICs that utilize the disclosure. The microprocessor 91 can include an internal cache memory that uses the concepts of the disclosure. The memory 93 may also include memory ICs that uses the concepts of the disclosure. The microprocessor 91 is further connected to such support circuits as a display device 97. The computer system 90 can also incorporate memory ICs that utilizes certain concepts of the disclosure.

The disclosed memory structures 20, such as shown in FIG. 1, can be implemented using semiconductor equipment. For example, the conductors can be formed by deposition of a metal layer followed by patterning by photolithographic masking and etching. Dielectric regions can be formed by deposition of dielectric material using sputtering, chemical vapor deposition, physical vapor deposition, or a variety of other known processing techniques. The oxide layers can be formed by deposition of an oxide, deposition of a metal followed by oxidation of the deposited metal, or oxidation of a metal feature. Such deposition techniques as electrochemical deposition can be used to deposit metal or other electrical conductors. Chemical mechanical polishing (CMP) can be employed to planarize and/or expose desired regions. Also, damascene processes such as dual damascene can be employed. In dual damascene processes, ILD is etched to form the boundaries of the vias, metal is deposited on the etched ILD to form the vias, and CMP is performed.

Figure 12:
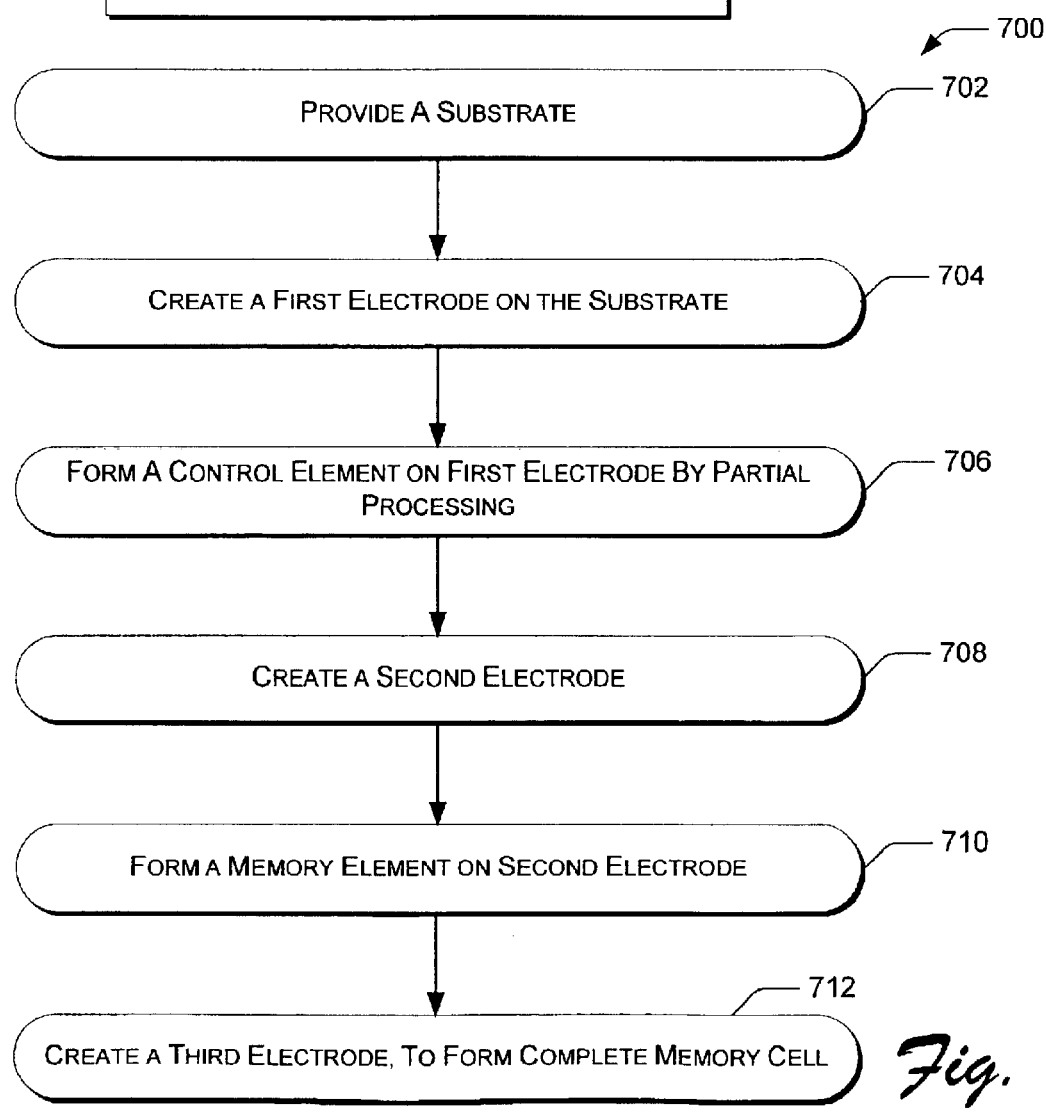
FIG. 12 is a flow diagram of an example of an embodiment of a process for making the disclosed memory structures.

Referring now to FIG. 12, the disclosed structures can generally be made as described in a process 700. The process 700 includes 702 in which a substrate is provided. At 704 a first electrode is created by, e.g., depositing and patterning a metal layer to form the conductor or the conductive lines. At 706 a control element 25 of a predetermined device type is formed on the first electrode. The control element can be formed using a variety of techniques such as by oxidizing the electrode or forming an unpatterned oxide layer as described above. The control element 706 is partially-processed as described relative to FIGS. 7 and 8. At 708 a second electrode is created, for example by depositing and patterning a metal layer to form an appropriate conductor. At 710 a memory storage element of the predetermined device type is formed on the second electrode, for example by oxidizing the electrode or forming an unpatterned oxide layer as described above. The memory storage element 23 is fully processed. At 712, a third electrode is created on the memory storage element. By providing each of the components shown in FIG. 12, a complete memory cell is created.

The order in which the memory storage element 23 is deposited compared with the control element 25 is arbitrary. As such, the control element 25 can be deposited following the memory storage element 23, or vice versa. In one embodiment, both the control element 25 and the memory storage element 23 are configured as tunnel junction devices. The processing level of the control element 23 is less than that of the memory storage element 23 in one embodiment of the present disclosure, however, to increase the breakdown voltage of the control element.

Although the disclosure has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A system, comprising:
   a memory storage element;
   a tunnel junction control element that is partially-processed such that a density of oxidation or nitriding is substantially higher in one portion of the control element than in another portion of the control element and
   a first electrode located between the memory storage element and the tunnel junction control element.

2. The system of claim 1, wherein a breakdown voltage of the tunnel Junction control element is greater than three volts (in either direction forward or reversed).

3. The system of claim 1, wherein the breakdown voltage of the partially processed tunnel junction control element is greater than the break-down voltage of the tunnel junction memory storage element.

4. The system of claim 1, wherein the tunnel junction control element is formed from an oxide.

5. The system of claim 1, wherein the tunnel junction control element extends substantially horizontally, and the memory storage element extends substantially horizontally, wherein the tunnel Junction control element and the memory storage element are vertically separated.

6. The system of claim 1, wherein the tunnel junction control element extends substantially horizontally, and the memory storage element extends substantially horizontally, and wherein the tunnel junction control element is horizontally spaced from the memory storage element.

7. The system of claim 1, wherein the tunnel junction control element is vertically spaced from the memory storage element.

8. The system of claim 1, wherein the tunnel junction control element is partially-processed by being oxidized.

9. The system of claim 1, wherein the partial processing of the tunnel junction control element is provided using a plurality of portions, at least one of the plurality of portions is not oxidized or nitrided while at least one of the plurality of portions is oxidized or nitrided.

10. The system of claim 1, wherein the memory storage element, the electrode, and the tunnel junction control element are all included in an integrated circuit.

11. The system of claim 1, wherein the system is a memory system.

12. The system of claim 1, further comprising a second electrode and a third electrode, wherein the memory storage element and the tunnel junction control element are both located between the second electrode and the third electrode.

13. The system of claim 12, wherein the memory storage element includes an oxide of the second electrode.

14. The system of claim 12, wherein the tunnel junction control element includes an oxide of the third electrode.

15. The system of claim 12, wherein the memory storage element includes a nitride of the second electrode.

16. The system of claim 12, wherein the tunnel junction control element includes a nitride of the third electrode.

17. The system of claim 1, further comprising a plurality of memory cells, each one of the plurality of memory cells includes a conductive tub, wherein multiple ones of the memory cells are implemented in stacked layers, wherein a conductor is vertically adjacent arm edge of an adjacent conductive tub.

18. The system of claim 1, wherein a cross-sectional area of the control element differs from the cross-sectional area of the memory storage element.

19. The system of claim 1, wherein the difference in cross-sectional area of the control element and the memory storage element provides an increased break down voltage of the control element compared to the break down voltage of the memory storage element.

20. The system of claim 1, wherein the memory storage element includes a fuse device.

21. The system of claim 1, wherein the memory storage device includes an antifuse device.

22. The system of claim 1, wherein the memory storage device includes a switch.

23. The system of claim 1, wherein the memory storage device includes a charge storage device.

24. The system of claim 1, wherein the materials used to form the memory storage device is selected from a group of materials, the group of materials include a resisitive material, a trap-induced hysteresis material, a ferroelectric capacitor material, a polymetric capacitor material, a Hall Affect material, and a tunneling magneto-resistive material.

25. The system of claim 1, wherein the memory storage element comprises an antifuse including material selected from a group of materials, the group of materials including an oxidized metal tunnel junction, a silicon dioxide tunnel junction, a dielectric-rupture, a polysilicon semiconductor, a polycrystalline semiconductor, an amophous semiconductor, a microcrystalline semiconductor, a metal filament electromigration semiconductor, and a polysilicon resistor semiconductor.

26. The system of claim 1, wherein the memory storage element includes a rewritable phase change material.

27. The system of claim 1, wherein the memory storage element includes an organic phase change material.

28. A memory structure comprising:
a plurality of layers of memory cells;
each memory cell of the plurality of layers of memory cells including a first electrode, a second electrode, a third electrode, a memory storage element disposed between the second electrode and the third electrode, and a control element disposed between the first electrode and the second electrode; and
the memory storage element having a density of oxidation or nitriding substantially higher than a density of oxidation or nitriding of the control element such that a breakdown voltage of the store element is lower than a breakdown voltage of the control element.

29. The memory structure of claim 28, wherein the control element is partially oxidized or nitrided.

30. The memory structure of claim 29, wherein the partial oxidation or nitriding results from oxidizing or nitriding the control element for a shorter duration than for a fully oxidized or nitrided control element.

31. The memory structure of claim 29, wherein the partial oxidation or nitriding results from the control element including a plurality of layers, certain of the layers of the control element are not oxidized or nitrided while certain ones of the layers of the control element are completely oxidized or nitrided.

32. The memory structure of claim 28, wherein the memory storage element is vertically spaced from the control element.

33. The memory structure of claim 28, wherein the memory storage element is horizontally spaced from the control element.

34. The system of claim 28, further comprising a plurality of memory cells, each one of the plurality of memory cells includes a conductive tub, wherein a plurality of the memory cells are implemented in stacked layers, wherein a conductor that is vertically adjacent the rim edge of a given conductive tub is vertically adjacent the base of a conductive tub that is in an adjacent layer.

* * * * *